United States Patent [19]

Echols et al.

[11] Patent Number: 4,490,639

[45] Date of Patent: Dec. 25, 1984

[54] COUPLING CIRCUIT BETWEEN HIGH IMPEDANCE PIEZOELECTRIC SIGNAL SOURCE AND UTILIZING CIRCUIT

[75] Inventors: John C. Echols, Ventura; Charles W. Staufenberg, Santa Barbara, both of Calif.

[73] Assignee: Essex-Tec Corporation, Carpinteria, Calif.

[21] Appl. No.: 529,270

[22] Filed: Sep. 6, 1983

[51] Int. Cl.³ .............................................. H01L 41/08
[52] U.S. Cl. ..................................... 310/319; 310/800
[58] Field of Search ............... 310/319, 338, 339, 800; 73/766, 769, 763; 340/365 A, 501

[56] References Cited

U.S. PATENT DOCUMENTS

| | | | |
|---|---|---|---|
| 3,243,792 | 3/1966 | Hamilton | 310/319 X |
| 3,899,698 | 8/1975 | Kleinschmidt | 310/319 X |
| 3,971,250 | 7/1976 | Taylor | 310/800 X |
| 4,328,441 | 5/1982 | Kroeger, Jr. et al. | 310/319 |

*Primary Examiner*—Mark O. Budd
*Attorney, Agent, or Firm*—Learman & McCulloch

[57] ABSTRACT

The high impedance output of a touch-sensitive piezoelectric sensor is coupled directly to the high impedance input of a CMOS (complementary metal oxide silicon field effect transistor pair). The CMOS is protected on its input side by clamps which restrict the voltage swing applied to the gates to within the range defined by the positive and negative CMOS bias supply ($+V_{DD}$ and $-V_{SS}$). The sensor produces voltages of approximately equal magnitude in response to slow acting temperature changes and quicker acting manual touching. In order to distinguish piezoelectric from pyroelectric signals, the CMOS bias is periodically and briefly shorted, to ensure a brief return-to-zero of the sensor output, thereby effectively suppressing the slow acting pyroelectric signal without interfering with sensing of quick acting piezoelectric signals.

6 Claims, 7 Drawing Figures

COUPLING CIRCUIT BETWEEN HIGH IMPEDANCE PIEZOELECTRIC SIGNAL SOURCE AND UTILIZING CIRCUIT

BACKGROUND OF THE INVENTION

This invention relates to the electrical coupling of a touch-sensitive piezoelectric transducer to a voltage-responsive electric control circuit, and more particularly to a circuit for performing the coupling function in a reliable manner, despite the high impedance of the piezoelectric transducer output. The circuit is adapted for use with a keyless access system in which access to a locked area is obtained by the operation of a series of numbered or lettered buttons in a predetermined sequence.

A number of patents has been allowed for such access systems, among which is Haygood et al, U.S. Pat. No. 4,205,325 which discloses a sophisticated system wherein an operator selectively enters a five digit number into a keyboard on the door of a vehicle in order to gain access, open windows or trunk, etc. The keyboard has an individual switch for each key, and closure of the switch is achieved by pressing the associated key so that the operation is analagous to the selective depressing of a series of old fashioned push buttons.

Other patents relating to access systems are Ligman et al, U.S. Pat. No. 4,206,491 and Kompanek, U.S. Pat. No. 4,190,785. Patents relating to touch sensitive piezoelectric transducers and their manufacture are Kompanek U.S. Pat. No. 4,193,010 and Kompanek U.S. Pat. No. 4,056,654.

SUMMARY OF THE INVENTION

A piezoelectric sensor is used to detect the manual actuation of a touch button. The electric signal given off by the piezoelectric sensor is used to control electronic circuitry which, in turn, controls mechanical equipment, such as the bolt of a door lock. Since the output of the piezoelectric sensor is at an exceedingly high impedance level (of the order of the impedance level of ambient static electricity on a dry day) it is difficult to couple the signals from the piezoelectric sensor to electronic circuitry.

In the instant invention the piezoelectric sensor is coupled to an adjacent CMOS (complementary metal oxide-silicon field effect transistor), which normally has an enormous input impedance. Thus, there is a good impedance match, as is required for transfer of signals from the sensor to the CMOS. The CMOS is protected against excessive voltage input (which would destroy the thin insulating layer of the gate structure) by clamps which limit the maximum swing of the input signal to the range defined by the positive and negative sides of the transistor bias supply, $+V_{DD}$ and $-V_{SS}$, respectively. In the disclosed embodiment these voltages are +5 and zero, respectively. Normally the voltage swing caused by manual actuation of the piezoelectric sensor can be much larger, but no harm is done by clipping the larger signal, for the limited input swing is more than ample to swing the binary output signal of the CMOS between high and low.

The piezoelectric sensor produces the desired output when it is stressed by a manual touch. However, the piezoelectric sensor also produces an undesired pyro-electric signal whose magnitude is roughly as large as the piezoelectric signal. The pyroelectric signal is caused by ambient temperature changes. Thus, the CMOS circuitry may respond improperly or not at all to the piezoelectric signal, which may be swamped by the unpredictable pryoelectric signal. The pyroelectric signal can also remain high for long periods of time.

In order to distinguish between the two kinds of signals, use is made of the fact that the piezoelectric signals, caused by the stress of manual touching, vary much more rapidly than the pyroelectric signal changes, caused by thermal changes.

This is done by periodically and briefly shorting together the positive and negative sides of the CMOS bias supply, so that the output of the piezoelectric sensor is briefly clamped to zero volts. Thus, the circuit is periodically restored to a zero voltage reference state, without the use of a shunting resistor on the output of the piezoelectric sensor.

The periodic shorting of the bias supply does not interfere with sensing of piezoelectric signals because a normal manual touch will cause increasing stress during several cycles of the shorting. On the other hand, the build up of a pyroelectric signal within one cycle is insufficient in magnitude to swamp the piezoelectric signal resulting from manual touching of the sensor.

THE DRAWINGS

FIG. 1 is a schematic diagram showing a piezoelectric sensor coupled to a CMOS which is powered by a pulsed bias supply; and FIG. 2 is a group of aligned graphs showing conditions at different times in the circuit of the invention.

DETAILED DESCRIPTION

Figure 1:
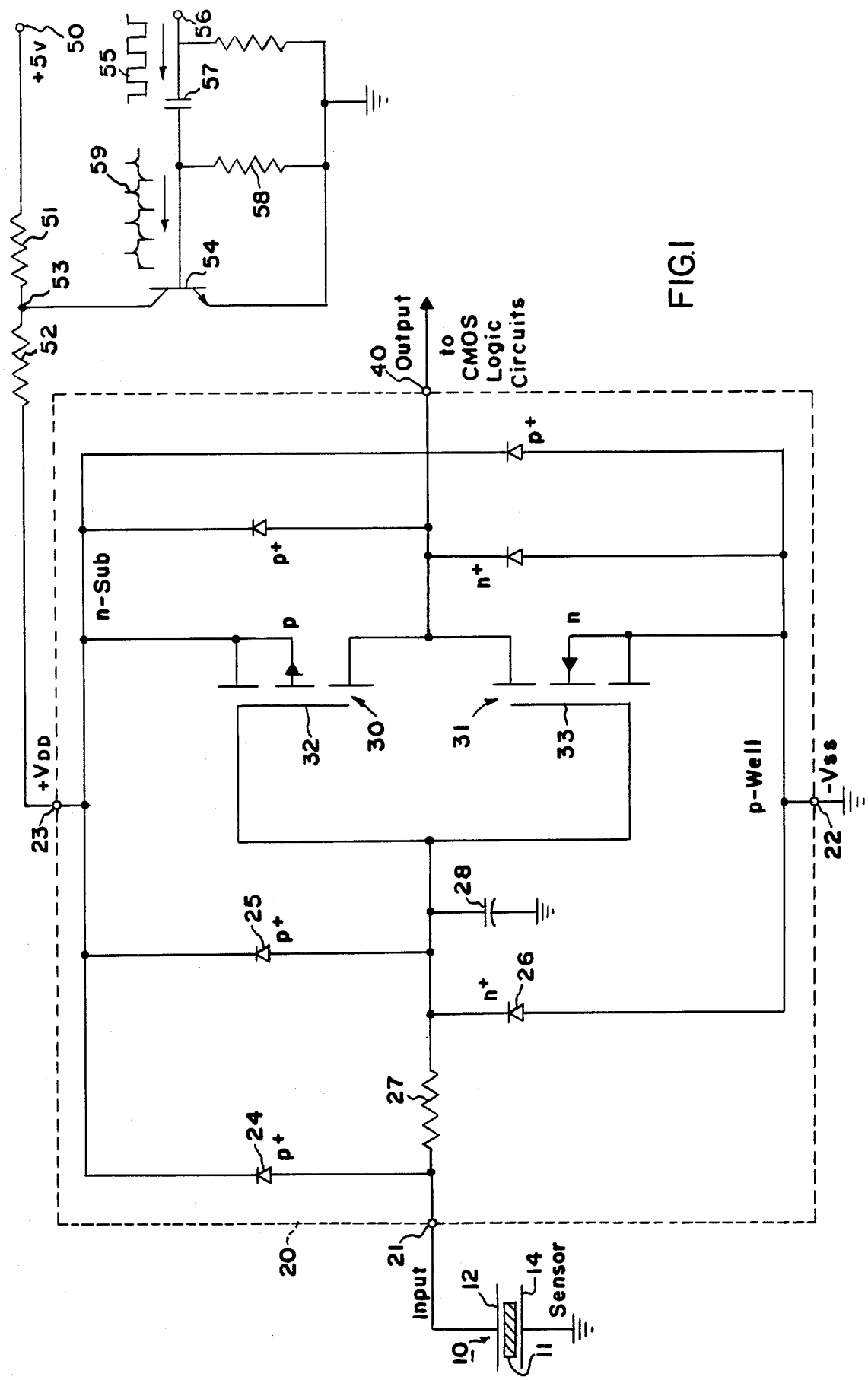

Apparatus according to the invention includes a touch-sensitive piezoelectric sensor 10, represented by the conventional symbol for a piezoelectric device. The actual construction of such a sensor may be as disclosed in the patent to Kompanek, U.S. Pat. No. 4,190,785. In any event, the sensor has a piezoelectric element 11 which, when stressed by touching of the touch pads of the sensor, will develop a direct voltage between its upper and lower surfaces by electric charge transfer within the body of the piezoelectric element 11. The voltage, by capacitive coupling, appears as a voltage between the electrodes 12 and 14. Since this voltage is the result of a charge transfer, and since the amount of the charge is directly proportional to the stress and therefore limited, it follows that this voltage has no power behind it, and cannot drive a continuing current. This voltage must therefore be sensed by equipment which draws no significant current from the piezoelectric sensor 10.

The piezoelectric sensor 10 produces the piezoelectric voltage instantaneously and in direct proportion to the pressure of an operator's finger on the pressure pad, since electric output is directly proportional to stress. When an operator operates the pressure pad rapidly, in the manner of a typist, the finger pressure will increase monotonically for a period of, perhaps, twenty-five milliseconds, level off during perhaps another twenty-five milliseconds, and then taper off to zero during perhaps another twenty-five milliseconds. In the operation of the circuit described below, the fact that the minimum rise time of the piezoelectric voltage is, roughly, in the range of twenty-five milliseconds, is significant.

Besides the piezoelectric signal, the sensor 10 also produces a pyroelectric signal having a magnitude comparable to that of the piezoelectric signal. The pyroelectric signal is produced instantaneously with a change of temperature, but temperature can change only slowly. For example, there is considerable thermal resistance between an operator's fingertip and the piezoelectric element 11, since there conventionally is a pressure pad and other items such as a waterproof membrane and a protective structural barrier between. Thus, a warm fingertip will cause only a slow temperature rise. A change of temperature caused by a large source of heat, such as the sun shining on the automobile, also causes a relatively slow temperature rise of the piezoelectric element 11, which is partly protected against rapid temperature changes by the thermal inertia of its mounting housing. In the operation of the circuit described below, the fact that the minimum rise time of the pyroelectric voltage is perhaps a second or so, also is significant.

The electrical output at electrode 14 is referenced to ground and the resulting single ended electrical output from electrode 12 is connected to the input terminal 21 of CMOS (complementary metal-oxide-silicon field effect push-pull amplifier) 20, which is also referenced to ground at its negative bias supply terminal 22. Positive bias is applied to positive bias terminal 23.

The CMOS 20 may be of any several commercial types, such as the 4009, 4010, or 4069, manufactured by RCA, Motorola, and others. These amplifiers have incorporated into the semiconductor chip in which they are formed excess-voltage protective means on both the input and output sides of the amplifier. The excessive voltage protective means on the input side are formed by clamping diodes 24, 25, and 26 and resistor 27 Diode 24 and diode 25, in conjunction with resistor 27, prevent the input signal, applied to the two field-effect transistors 30 and 31, from going significantly more positive than the positive voltage $V_{DD}$ at positive bias terminal 23. Diode 26, in conjunction with resistor 27, prevents the voltage from going significantly more negative than the grounded reference voltage $V_{SS}$ at negative bias terminal 22. The internally grounded capacitor 28, in conjunction with resistor 27, prevents the application of any over voltage from high voltage spikes, such as those from nearby discharges of static electricity. Thus, the field effect transistors 30 and 31 are protected against having their oxide barrier pierced by excessive input voltage.

If the input voltage at terminal 21 has a magnitude in the range between the voltages of bias supply terminals 22 and 23, the diodes 24, 25, and 26 will not conduct. Accordingly, the electrode 12 of the piezoelectric sensor 10 is connected to gates 32 and 33 of field effect transistors 30 and 31 by a circuit which has no shunt resistive loading and negligible shunt capacitive loading, since the CMOS 20 is adjacent to the piezoelectric sensor 10. Thus, any voltage developed by piezoelectric sensor 10 is applied to the gates 32 and 33 with substantially no loss. Under this condition, the enormous output impedance of the piezoelectric sensor 10 is well matched to the enormous input impedance of gates 32 and 33, in parallel.

If, on the other hand, the input voltage at terminal 21 is at a level beyond the range delimited by the voltages of bias supply terminals 22 and 23, the voltage clamping diodes 24 and 25 or 26 conduct and the input impedance at 21 is low.

The output terminal 40 may be connected to logic circuits, not shown, which can be used for any selected one of a wide variety of uses. For example, the output may be used to lock or unlock a door or ignition circuit. The logic circuits should be compatible with the CMOS 20, so CMOS logic curcuits are preferred.

Bias voltage is applied to terminal 23 from a +5 volt source terminal 50 by way of two resistors, 51 and 52. The junction 53 between resistors 51 and 52 is connected to the collector of grounded emitter NPN transistor 54. The base of transistor 54 is driven by a differentiated square wave signal. This is obtained from a square wave signal 55, having a repetition rate of about 125 pulses per second, applied to terminal 56. The square wave is differentiated by capacitor 57 and resistor 58, having a time constant of a few microseconds, to produce the pulse train or wave 59 having alternate positive and negative spikes.

When the base of NPN transistor 54 is pulsed highly positive by the positive pulses of the wave 59, transistor 54 conducts heavily and pulls down the potential of junction 53 substantially to ground potential for a period of about a microsecond, after which the lessening amplitude of the short positive spikes of wave 59 no longer are effective to keep NPN transistor 54 in a conductive state. When the base of transistor 54 is at ground potential or when it is pulsed negatively the transistor 54 also is not conductive. Thus, about every 8 milliseconds the CMOS 20 is deprived of bias between terminals 23 and 22 for a period of about 1 microsecond. During that brief period, any voltage supplied to input terminal 21 by electrode 12 will be shorted to ground.

Figure 2:
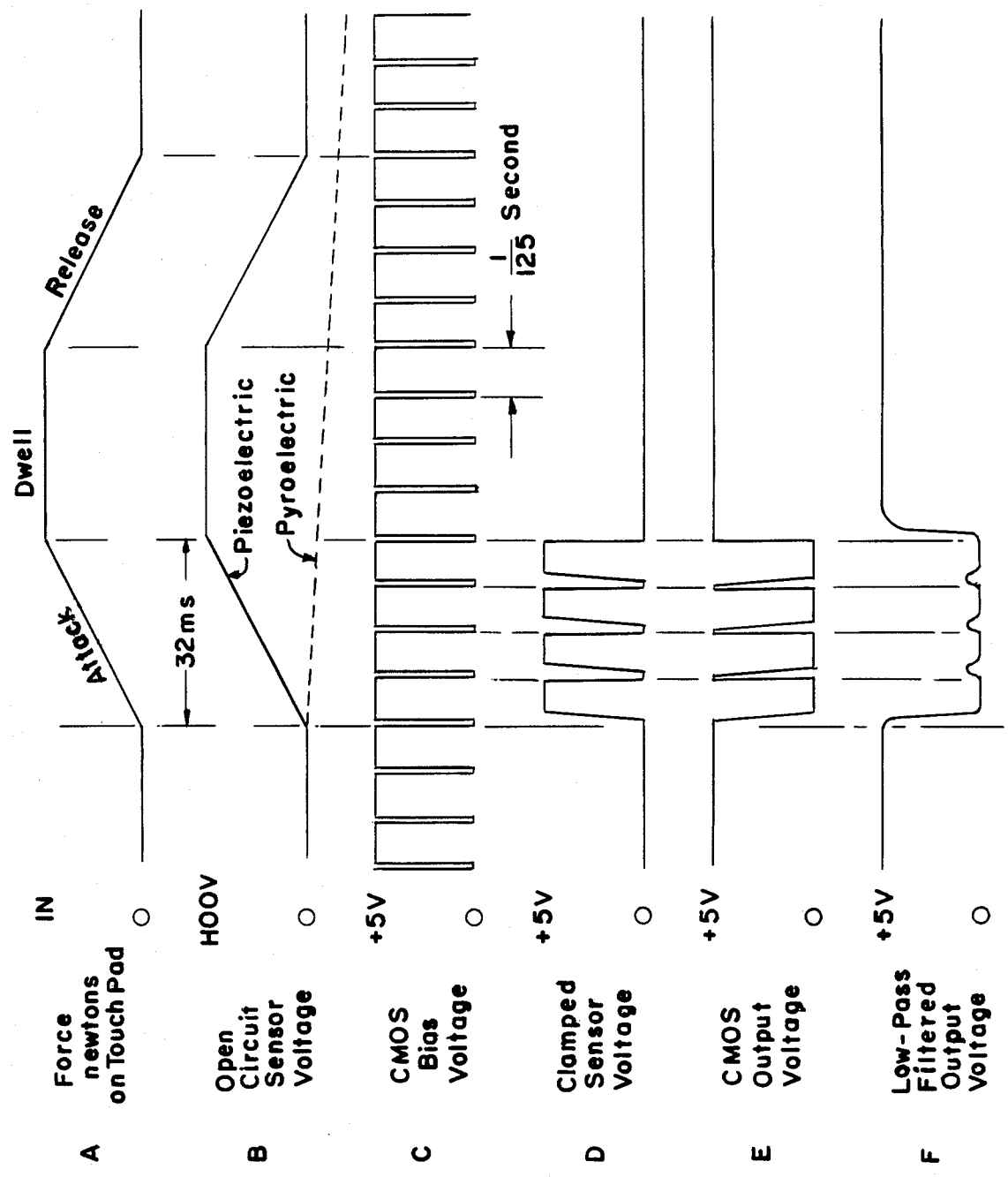

The operation of the system of FIG. 1 is best understood by reference to the six aligned time graphs of FIG. 2. Graph A shows the variation in contact pressure in newtons of a conventional quick finger stroke on a touch pad. During an attack phase lasting 32 milliseconds the force on the touch pad increases. During a dwell phase of 32 milliseconds the force is constant. During a release phase of 32 milliseconds the force decreases. While this representation may be rather crude, it does not differ grossly from reality, and the assumptions of the representation simplify the explanation.

The solid line of graph B shows the resulting piezoelectric voltage generated by operation of the sensor 12. For purposes of explanation the voltage is represented as increasing positively during the attack phase, so that the circuit is activated on the attack phase. (If the leads from electrodes 12 and 14 were reversed, the piezoelectric voltage would be negative during the attack phase, and the circuit would not be activated until the release phase, when the piezoelectric voltage would, under that condition, be positive). The piezoelectric voltage graph B is similar to the force graph A, since piezoelectric voltage is directly proportional to stress.

The dotted line labeled pyroelectric in graph B will be discussed below.

Graph C shows the CMOS bias voltage at terminal 23. The bias is essentially continuous and constant at +5 volts, but is interrupted every 8 milliseconds for a brief moment, shown greatly exaggerated in the time dimension, of about one microsecond in duration. Thus, the duty ratio of the bias supply is 7999 to 1.

When the bias supply at bias terminal 23 is interrupted for the brief period of about one microsecond, any positive voltage present at the gates 32 and 33 is shorted to ground through clamping diodes 24 and 25. Such voltage may be caused by a charge transfer within the piezoelectric element 11, and when the short is removed, by reenergization of the positive bias terminal 23, the voltage does not restore itself. Consequently, as shown by graph D, the voltage at the input terminal 21 stays at zero when the piezoelectric sensor has no output, and it is held clamped at zero during those moments of the attack phase when the bias supply at bias terminal 23 is zero. However, throughout the attack phase the piezoelectric element 11 is being increasingly stressed, and continues to produce further charge transfer in accordance with the stress, resulting in a voltage build up at the rate of 10 volts every 32 milliseconds (see graph B), resulting in a steeply rising triangular wave, as shown by the slanted voltage rises of graph D. When the rise reaches +5 volts, it causes the clamping diodes 24 and 25 to conduct, and the triangular wave is truncated at +5 volts, as shown in graph D.

During the dwell phase no further charge transfer occurs within piezoelectric element 11, and the clamped sensor voltage of graph D therefore stays at zero voltage.

During the release phase, the piezoelectric sensor 10 has a tendency to output a negative signal because of the descending open-circuit sensor voltage of graph B and because of the intermittent clamping to zero voltage. However, the voltage at the gates 32 and 33 cannot go negative because of the action of clamping diode 26.

The particular CMOS amplifier 20 illustrated in FIG. 1 has a configuration which makes it an inverter. Thus, the clamped sensor voltage wave of graph D appears as an inverted output wave, as shown by graph E. Before being used by the logic circuits controlled by the piezoelectric sensor 10, the inverted wave would be subjected to low pass filtering, producing the final output voltage wave shown in graph F. The wave form shown in graph F has a shape which is satisfactory for controlling logic circuits.

When a piezoelectric element, such as 11, is directly connected to an amplifier without any shunt loading, the amplifier will respond to both the piezoelectric and pyroelectric signals from the piezoelectric element. The piezoelectric and pyroelectric signals can be of comparable magnitude. However, the piezoelectric signal is proportional to stress, which can change rapidly, as, for example, during the attack phase. The pyroelectric signal, on the other hand, is proportional to change of temperature, which normally occurs much more slowly. Thus, in graph B, a possible pyroelectric signal is shown in dotted lines which slannts negatively at a gentle slope. It is apparent that, when the slowly changing pyroelectric signal is added to the more rapidly changing piezoelectric signal, the shape of graph D will not be appreciably altered. The rapidly changing signal swamps the effects of the slowly changing signal because of the intermittent action of the clamping diodes, which restores both signals back to a zero reference level.

What is claimed is:
1. In combination:
   a. a touch-sensitive piezoelectric sensor for producing a piezoelectric output at a pair of output terminals in response to touching of the sensor and a pyroelectric output at said pair of output terminals in response to a temperature change of the sensor, whereby said touch-sensitive piezoelectric sensor may produce a composite output signal at said pair of output terminals, said pyroelectric output varying concurrently with the relatively slower varying temperature changes of said touch-sensitive piezoelectric sensor, and said piezoelectric output varying concurrently with the relatively rapid variations of the force of said touching on said touch-sensitive piezoelectric sensor;
   b. an amplifier having a high impedance input and having an output;
   c. means for connecting said output terminals of said touch-sensitive piezoelectric sensor to the high impedance input of said amplifier; and
   d. periodically activated means for causing said amplifier to respond to the piezoelectric component only of said composite signal, whereby said amplifier delivers at its output a signal indicative only of said touching and independent of said temperature changes.
2. The combination of claim 1 wherein:
   said periodically activated means is a clamping means, connected in shunt to the means for connecting said output terminals to said high impedance input, said clamping means being periodically activated to substantially short circuit and reduce substantially to zero said composite signal, said clamping means producing substantially no electrical loading of the means for connecting said output terminals to said high impedance input when said clamping means is not activated.
3. The combination of claim 1 wherein:
   said periodically activated means is a clamping means comprising:
   a diode having one pole connected to said means for connecting said output terminals to said high impedance input;
   a source of periodic voltage pulses separated by short periods of no voltage; and
   means for supplying said pulses to the other pole of said diode.
4. The combination of claim 3 including:
   means to supply said pulses to said amplifier as bias for the amplifier, whereby said amplifier will be activated for the duration of said periodic voltage pulses and inactivated for the duration of said short periods.
5. In combination:
   a. a piezoelectric sensor capable of generating slowly changing pyroelectric signals superimposed on more rapidly changing piezoelectric signals;
   b. an amplifier having a high input impedance and having its input connected to said piezoelectric sensor, said amplifier having plus and minus bias terminals, and said amplifier having voltage clamping means on its input side to prevent the voltage thereat from varying substantially beyond the range of voltage between the limits defined by the voltages of said plus and minus bias terminals;
   c. means for supplying bias to said plus and minus bias terminals comprising a source of direct current electrical power and series impedance means connecting said source to said plus and minus bias terminals;
   d. switchable load means of low impedance connected in shunt to said means for supplying bias;
   e. means for periodically switching said switchable load on to pull down the bias available at said plus and minus bias terminals to substantially zero;
   f. and means for alternately switching said load off to permit said bias available at said plus and minus terminals to be unaffected by said switchable load; whereby the bias for said amplifier is periodically and alternately switched on and off; said voltage clamping means periodically reduces the composite pyroelectric and piezoelectric signal received by said high impedance amplifier from said piezoelectric signal substantially to zero voltage; and g. the periodicity of switching of said bias on and off being such that the slowly changing pyroelectric signal will not change significantly during any one period while the rapidly varying piezoelectric signal will change enough during one period to cause the voltage clamping means to limit the magnitude thereof.

6. The combination of claim 5 in which the periodicity is approximately 1/125 second.

* * * * *